US006511524B2

(12) United States Patent
Nozawa

(10) Patent No.: US 6,511,524 B2
(45) Date of Patent: Jan. 28, 2003

(54) METHOD AND DEVICE FOR PRODUCING BALL-SHAPED METALLIC PARTICLES AT LEAST ALMOST EQUAL IN DIAMETER

(75) Inventor: Akira Nozawa, Utsunomiya (JP)

(73) Assignee: Yugen Kaisha Shoukiseisakusho, Utsunomiya (JP)

( * ) Notice: Subject to any disclaimer, the term of this patent is extended or adjusted under 35 U.S.C. 154(b) by 0 days.

(21) Appl. No.: 09/840,873

(22) Filed: Apr. 25, 2001

(65) Prior Publication Data

US 2002/0092376 A1 Jul. 18, 2002

(30) Foreign Application Priority Data

Jan. 12, 2001 (JP) ....................................... 2001-004415

(51) Int. Cl.[7] .................................................... B22F 9/06
(52) U.S. Cl. .......................................... 75/335; 266/202
(58) Field of Search .......................... 266/45, 202, 201; 75/335

(56) References Cited

U.S. PATENT DOCUMENTS 4,264,641 A 4/1981 Mahoney et al.
4,428,894 A * 1/1984 Bienvenu ........................ 264/9
4,762,553 A 8/1988 Savage et al.
5,266,098 A * 11/1993 Chun et al. .................... 75/335
5,445,666 A * 8/1995 Peschka et al. ............... 75/335

FOREIGN PATENT DOCUMENTS

JP 63-43794 2/1988
JP 1-184201 7/1989
JP 2000-144216 5/2000
JP 0200106470 A * 3/2001

* cited by examiner

*Primary Examiner*—Scott Kastler
(74) *Attorney, Agent, or Firm*—Wenderoth, Lind & Ponack, L.L.P.

(57) ABSTRACT

Method and device for producing ball-shaped metallic particles substantially equal in diameter are disclosed. The device comprises a cylindrical metallic housing and a vessel provided on the cylindrical metallic housing. The vessel has a plurality of small openings through a bottom plate thereof. A vibrator is disposed above the vessel in a manner that the vessel may be subjected to vibration. A pair of pipes are provided to deliver and fill nitrogen or inert gas within the housing. An inclined bottom plate having a soft layer is arranged at a bottom portion of the housing to form a shielding structure. An exhaust pipe is provided at an outlet of the inclined bottom plate, and a selector is arranged at a bottom outlet of the shielding structure.

24 Claims, 4 Drawing Sheets

10
18
30
16
14
12b
12a
12
14b
14a
30a
12c
22
30b
24a
G
24a
24
24
30c
20a,20b
20
20c
26a
26
30d
28

METHOD AND DEVICE FOR PRODUCING BALL-SHAPED METALLIC PARTICLES AT LEAST ALMOST EQUAL IN DIAMETER

BACKGROUND OF THE INVENTION

1. Field of the Invention

A great many of small ball-shaped metallic particles are widely used for soldering or powder metallurgy. A number of methods and devices for producing particles of this type from a molten metal are known. For example, particles of liquid metal are produced by means of dissecting liquid metal above a gas stream flowing against the force of gravity, wherein the particles adopt a ball shape due to the surface tension of the liquid metal and solidification.

In another method, a metallic wire or plate is cut into pieces, each having a given length, which are pressed and rolled into small metallic particles, or alternately the cut pieces are melted and the molten metal is rolled into small metallic particles.

The small ball-shaped metallic particles thus produced have the disadvantage that there is a difference of the melting temperatures of the small metallic particles made from the starting material made from an end portion and that of a middle portion thereof.

As a result, there is a tendency that when spontaneous soldering of semiconductor circuits is carried out at a determined temperature, some portions of the circuits are not soldered.

It is likely that some metallic particles are either deformed or their surfaces are damaged.

A good small ball-shaped metallic particle usually has a brilliant metallic luster on its surface so that the quality of the produced metallic particle can be judged by quality of the luster of the small ball-shaped metallic particle as its standard.

2. Description of the Prior Art

According to the recent method described in the published specification of Japanese Patent Publication No. 43794/1987 (not-examined), molten metal is sprayed into the air. As shown in the published specification of Japanese Patent Publication No. 184201/1988, the method of producing the small ball-shaped metallic particles is shown, in which a molten stream of metal flows under pressure through an opening of a container in order to produce the small ball-shaped metallic particles under the surface tension.

There is a tendency, however, for the above method to produce a lot of either deformed or damaged small ball-shaped metallic particles, thus providing a lower yield. Accordingly, it is rather difficult to efficiently produce a number of good small ball-shaped metallic particles.

As shown in the published specification of Japanese Patent Publication No. 144216/2000 (not-examined), liquid metal is discharged through an opening of a container to atomize in the air and to solidify into droplets by the surface tension of the liquid metal.

In accordance with this method, however, liquid metal particles are dropped into an oily solution which does not vaporize even at 200° C. in order to prevent collision of the dropping small particles with each other or to avoid a deformation by a shock on a hard bottom plate.

This method, however, has the disadvantage that the metallic surfaces of the produced metallic particles are oxidized by the oily solution, thereby preventing an independent brilliant metallic luster on the surfaces of the produced small ball-shaped metallic particles.

SUMMARY OF THE INVENTION

A primary object of this invention is to provide a method for producing small ball-shaped metallic particles substantially equal in diameter that can be used for soldering a base circuit of semiconductors.

Another object of this invention is to provide a device for producing small ball-shaped metallic particles substantially equal in diameter that can be used for soldering a base circuit of semiconductors.

Another object of this invention is to provide a device for producing small ball-shaped metallic particles substantially equal in diameter having better physical, structural and homogeneous properties.

Another object of this invention is to provide a method for producing small ball-shaped metallic particles substantially equal in diameter without a troublesome washing process for recovering the metallic particles in an oily solution.

Another object of this invention is to provide a method for producing small ball-shaped metallic particles substantially equal in diameter without a troublesome disposal of waste oil.

Another object of this invention is to provide an easily made device, which is simple in construction.

Another object of this invention is to provide a method for producing small ball-shaped metallic particles substantially equal in diameter whereby soft droplets drop on a soft inclined bottom plate, thus eliminating dents, flaws or deformations on the surface of the metallic particles as a result of cushioning of the soft inclined bottom plate.

Still another object of this invention is to provide small ball-shaped metallic particles substantially equal in diameter.

BRIEF DESCRIPTION OF THE DRAWINGS

This object and features of the invention will become apparent from the following description taken in conjunction with the preferred embodiment thereof with reference to the accompanying drawings, in which.

DESCRIPTION OF THE PREFERRED EMBODIMENTS

Figure 1:
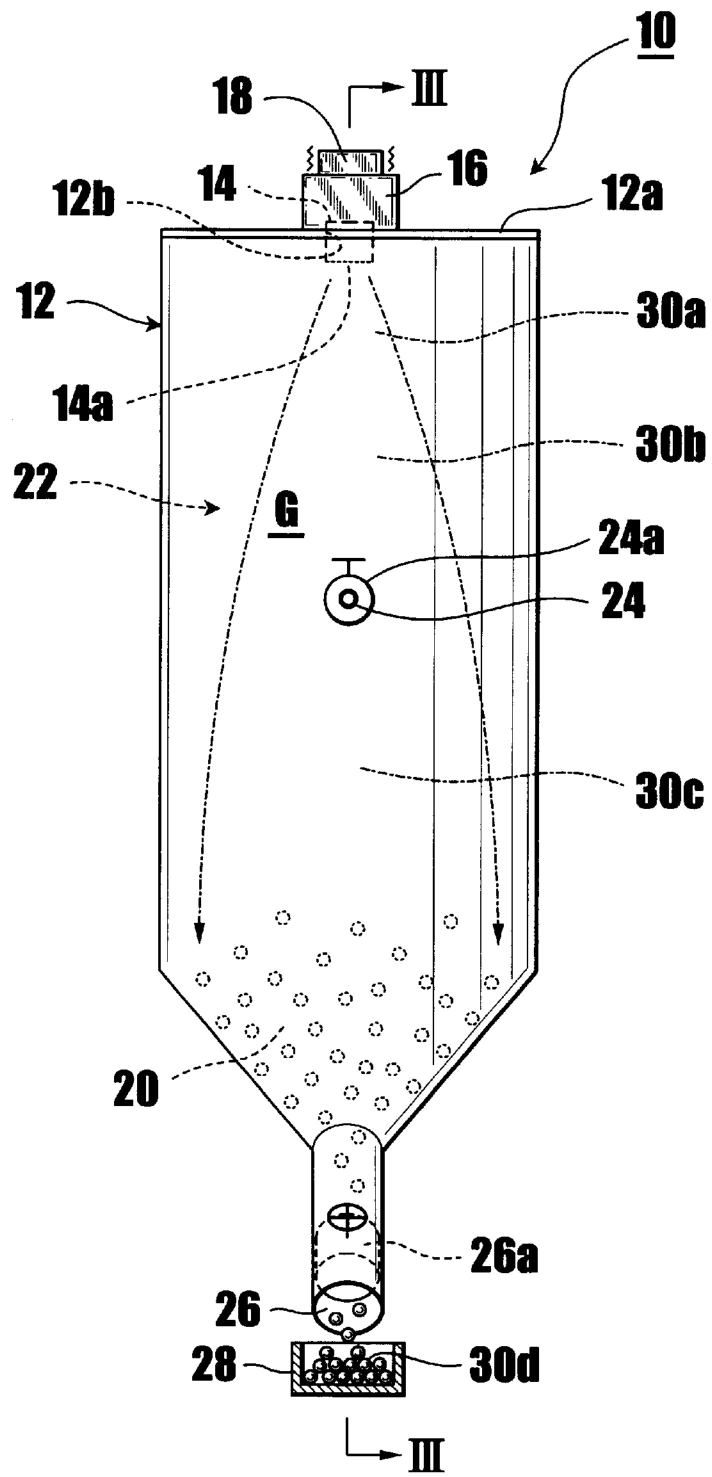
FIG. 1 is a front elevation, partly in perspective, of a device for producing ball-shaped metallic particles at least almost equal in diameter.
Figure 2:
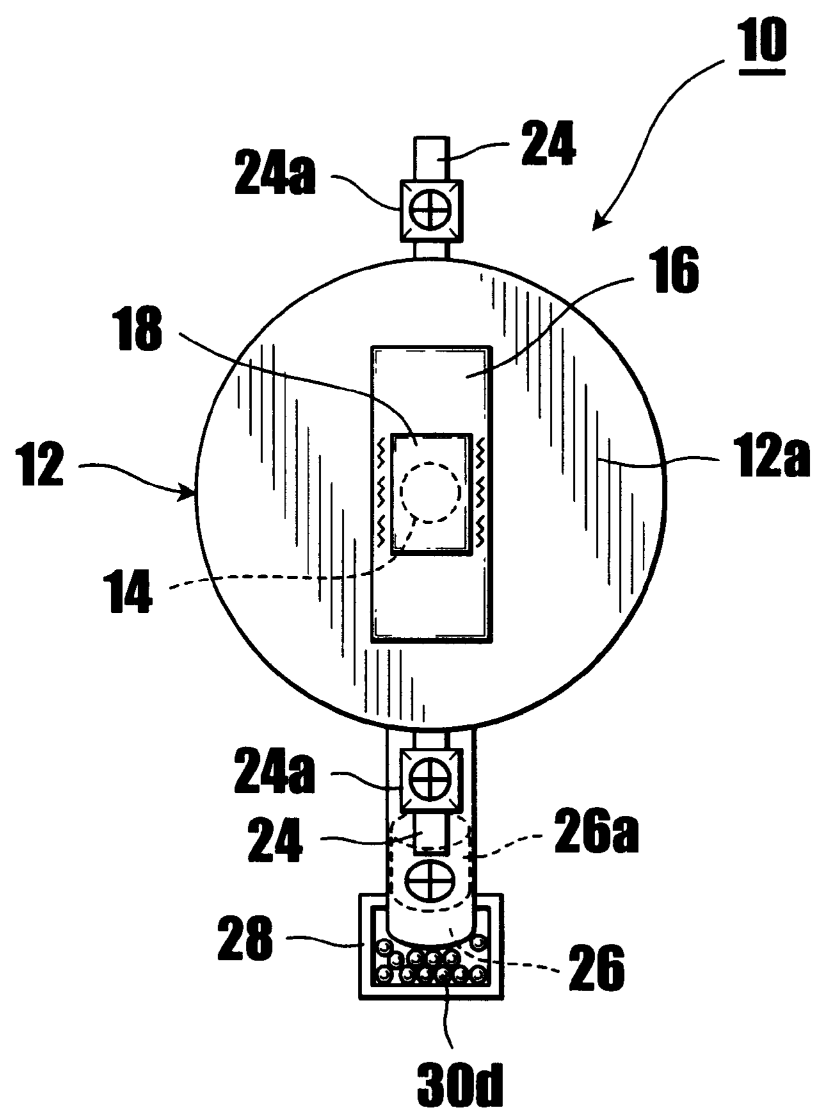
FIG. 2 is a plan view of the device shown in FIG. 1.
Figure 3:
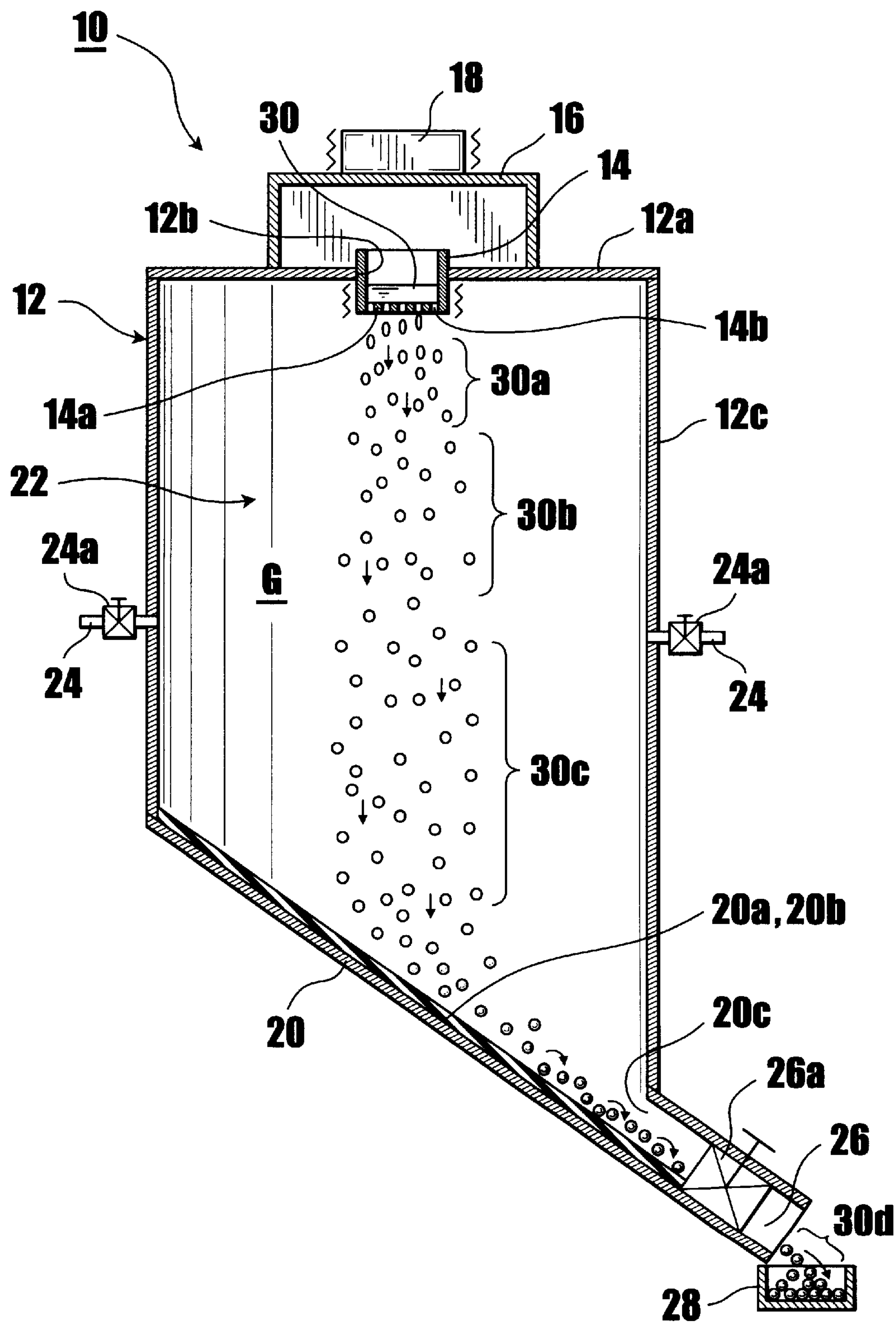
FIG. 3 is an enlarged schematic longitudinal sectional view of a device for producing small ball-shaped metallic particles at least almost equal in diameter of this invention, taken on line 111—111 of FIG. 1.

Referring now to the drawings, especially FIGS. 1–3, a device 10 for producing small ball-shaped metallic particles substantially equal in diameter comprises a cylindrical metallic housing 12 and a vessel 14 which is provided through a central opening **12*b* located at a middle portion of the ceiling 12*a* of the cylindrical metallic housing 12**.

Provided through a bottom plate **14*a* of the vessel 14 are a plurality of small openings 14*b* which are so small that a supply of liquid or molten metal 30 does not flow downwardly at a standstill condition by the surface tension of the liquid or molten metal 30**.

A vibrator 18 is disposed on a mount 16, which is arranged on the ceiling 12*a* to locate above the vessel 14 in a manner that the vessel 14 may be subjected to vibration by the vibrator 18.

A pair of pipes 24, each having a valve 24*a*, is provided to locate at a middle of opposing sides of the cylindrical metallic housing 12, thus enabling to deliver and fill nitrogen or an inert gas G within the housing 12.

An inclined bottom plate 20 having a soft layer 20*a* is arranged at a bottom portion of the housing 12 to form a shielding structure 22. An exhaust pipe 26 is provided outwardly at an outlet of the inclined bottom plate 20.

A selector 26*a* such as mesh, gravitation or wind selecting means is arranged at a bottom outlet 20*d* of the exhaust pipe 26.

In another embodiment, either soft plate 20*a* or cloth 20*b*, each having a high igniting point, which does not burn even at a high temperature can be mounted on the inclined bottom plate 20.

For example, an inorganic fiber such as rock wool, vegetable fiber or a soft plate made from pulp can be used for the soft plate 20*a*.

Inorganic fiber that is made from a woven fabric or soft cloth of vegetable fiber is used for the soft cloth 20*b*.

A composite or a plurality layer of the soft plates 20*a* or the soft cloth 20*b* can be preferably used, or alternatively a composite layer of the soft cloth 20*b* having a hollow air layer can be used.

It should be understood that a number of approximately small ball-shaped metallic particles 3*d* almost equal in diameter and having a luster on each surface could be manufactured continuously by the method and device of this invention.

EXAMPLE 1

The liquid or molten metal 30 is supplied into the vessel 14 having a plurality of the small openings 14*b* that are so small that the liquid or molten metal 30 is not allowed to flow downwardly through the openings 14*b* at a standstill condition as a result of the surface tension of the liquid metal 30.

A diameter of the opening 14*b* of the bottom plate 14*a* is small enough to prevent the liquid or molten metal 30 from flowing downward through the openings 14*b*.

When the vessel 14 is subjected to vibration by the vibrator 18, the liquid or molten metal 30 flows downwardly through the small openings 14*b* so that the segments of the dissected stream take a ball shape due to the surface tension of the liquid or molten metal 30 into a number of the molten droplets 30*a* in the shielding structure 22.

Further, the molten droplets 30*a* take on a ball shape during a free fall through the nitrogen or inert gas G surrounding them in the shielding structure 22.

The molten droplets 30*b* are cooled and solidified while dropping. The solidified droplets 30*c* drop and roll on the soft plate 20*a* or the soft cloth 20*b* towards the outside of the inclined bottom plate 20.

The solidified spherical droplets 30*c* rolling down on the soft plate 20*a* or the soft cloth 20*b* are delivered into a container 28, which is subsequently subjected to a selection by a known selecting device (not shown) to select a number of small approximately ball-shaped metallic particles 30*d* almost equal in diameter and having a luster on each surface of the metallic particles 30*d*.

EXAMPLE 2

The soft plate 20*a* or the soft cloth 20*b*, each having a high igniting point, is preferably used for the soft inclined bottom plate 20.

In accordance with the method and device of this invention, small approximately ball-shaped metallic particles 30 almost equal in diameter and having a luster on each surface can be manufactured continuously with a high yield.

EXAMPLE 3

Figure 4:
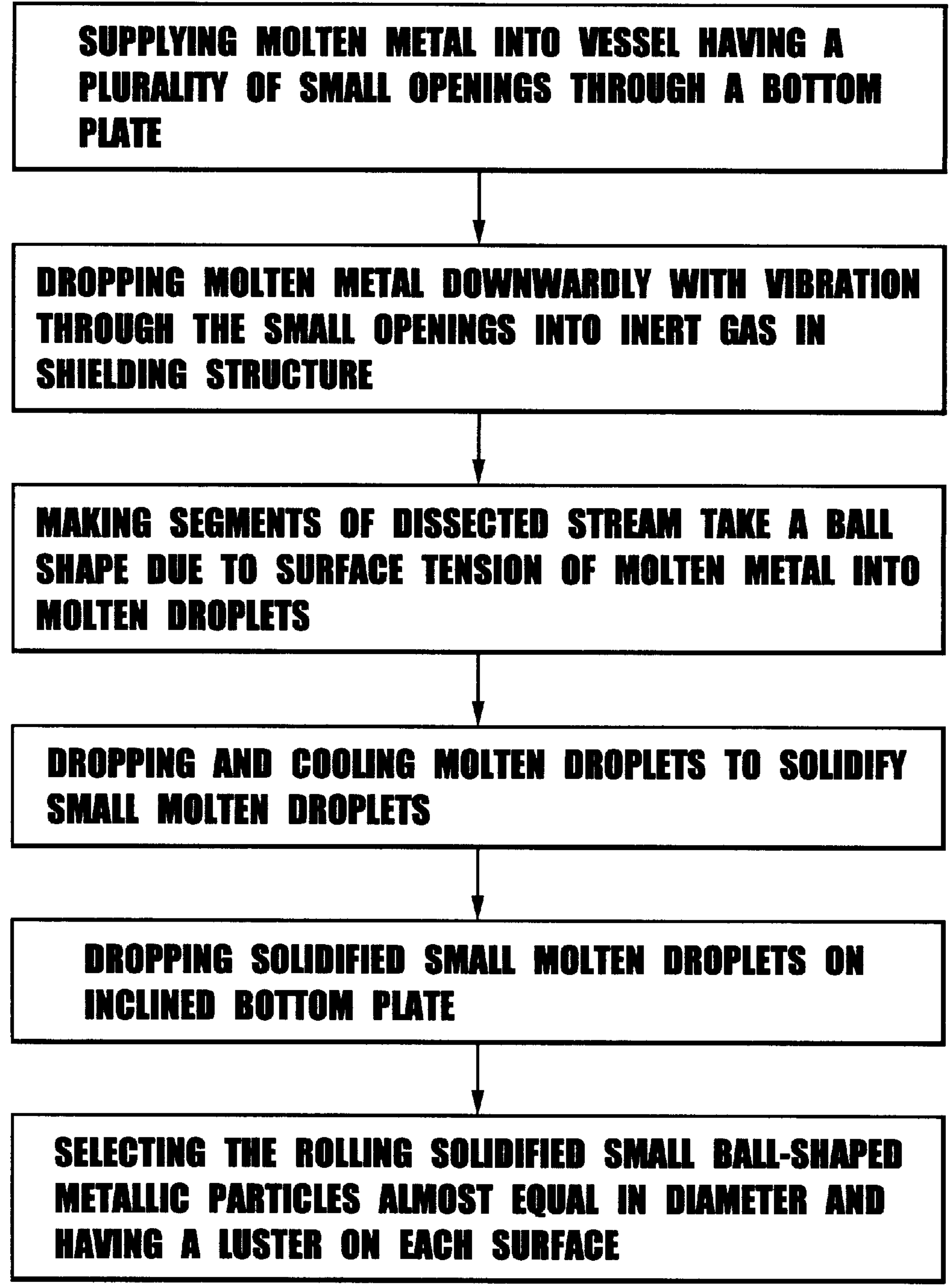
FIG. 4 is a flow-chart showing the steps of a method for producing small ball-shaped metallic particles at least almost equal in diameter of this invention.

A method for producing small ball-shaped metallic particles substantially equal in diameter of this invention is explained with reference to an embodiment shown in FIGS. 3 and 4.

As in the foregoing embodiments, a plurality of small openings 14*b* is provided at a given distance from the inclined bottom plate 20. The openings 14*b* are small enough so that the molten droplets 30*a* cannot flow through the opening 14*b* of the bottom plate 14*a* at a static condition.

A diameter of the opening 14*b* can be determined based on the type of metal used as the liquid metal 30, such as, tin, bismuth, zinc, aluminum etc.

When a diameter of the opening 14*b* of the bottom plate 14*a* is less than 0.2 mm, liquid metal 30 does not flow through the openings 14*b* by vibration only. Accordingly, it is necessary to apply additional pressure.

In this embodiment, the vessel 14 is subjected to vibration by the vibrator 18 to deliver the liquid metal 30 downward through the small openings 14*b* into an atmosphere containing no oxygen or inert gas G comprising nitrogen or a mixture of nitrogen and another gas in the shielding structure 22.

While dropping, the molten droplets 30*a* take on a ball shape while free falling through the nitrogen or inert gas G surrounding them in the shielding structure 22 as a result of the surface tension. In this embodiment, no oxygen exists around the surface of each droplet 30*a* so that it is not oxidized to have a metallic luster on the surface of the droplet 30*a*.

While dropping further, the ball-shaped droplets 30*a* are cooled into a certain degree and solidified.

Solidification of the dropping ball-shaped droplets 30*a* depends on the temperature of the atmosphere in the housing 12. Thus solidification requires a long cooling time along for a melting temperature and a given dropping height of the ball-shaped droplets 30*a*.

For example, a soldering material is dissolved at a temperature between 183° C.~300° C., and the dissolved soldering material solidifies at room temperature at a height between 5 m~6 m so that a height for dropping the metallic particles 30*a* must be over 5 m~6 m.

Aluminum is dissolved at a temperature around 600° C., and the dissolved aluminum solidifies at room temperature at a height between 45 m~50 m so that a height for dropping the metallic particles must be over 50 m.

When liquefied nitrogen is used to make a nitrogen atmosphere in the shielding structure 22, the liquefied nitrogen itself is used as a cooling gas at vaporization.

When the dropping atmosphere can be cooled, a cooling solidification can be accelerated to shorten the dropping height.

The solidified small ball-shaped metallic particles 30c drop on the soft inclined bottom plate 20, on which shock of the dropped ball-shaped metallic particles 30c are softened and dispersed by a cushion in order to prevent dents and deformation of the surface of the ball-shaped metallic particles 30c.

When the ball-shaped metallic particles 30c directly and vertically hit the hard inclined bottom plate 20, some of the ball-shaped metallic particles 30c are crushed or some plane portions thereof are formed on the spherical surfaces 30c. This destroys the small ball-shaped metallic particles substantially equal in diameter and also loses the brilliant metallic luster on the surfaces of the ball-shaped metallic particles 30c.

Subsequently, the ball-shaped metallic particles 30c roll downward into the exhaust pipe 26.

As mentioned in the foregoing paragraphs, when the ball-shaped metallic particles 30c directly and vertically hit the hard inclined bottom plate 20, the ball-shaped metallic particles 30c are either deformed or hurt by the dropping shock to lose brilliant metallic luster on the surfaces of the ball-shaped metallic particles 30c.

The ball-shaped metallic particles 30c are delivered into the selecting device to select a number of small approximately ball-shaped metallic particles 30d almost equal in diameter and having a luster on each surface.

EXPERIMENTAL EXAMPLE 1

The ball-shaped metallic particles 30d having a mixture of 63% of tin and 37% of lead were dropped on the hard inclined bottom plate 20 through the opening 14b of the bottom plate 14a from a height of 4 m.

In case a diameter of the opening 14b of the bottom plate 14a is less than 0.65 mm, the small ball-shaped metallic particles 30d almost equal in diameter and having no flaw, but having the luster on each surface can be made with a high yield.

In case a diameter of the small ball-shaped metallic particle 30d is over 0.66 mm, there appear many flaws and few luster on each surface of the produced small ball-shaped metallic particle 30d.

It has been confirmed by this experiment that collision of the small ball-shaped metallic particles 30d deteriorate their quality, and that the smaller the diameter of the particle 30d, the fewer the poor particles 30d.

EXPERIMENTAL EXAMPLE 2

The ball-shaped metallic particles 30d having a mixture of 10% of tin and 90% of lead were dropped on the hard inclined bottom plate 20 through the opening 14b of the bottom plate 14a from a height of 4 m.

In case a diameter of the small ball-shaped metallic particle 30d is 0.8 mm, the solidified ball-shaped metallic particle 30d is somewhat soft and there appear flaws on a surface of the 100% particles 30d.

When the soft solidified small ball-shaped metallic particles 30c drop on the soft inclined bottom plate 20, there appear no dents, flaws or deformation on the surface of the metallic particles 30c by a cushion of the soft inclined bottom plate 20.

This invention provides the method and device for producing small ball-shaped metallic particles substantially equal in diameter.

It is understood that modifications to the invention as described may be made, as might occur to one with skill in the field of the invention, within the scoped of the appended claims. All embodiments contemplated hereunder, which achieve the objects of the invention, have therefore not been shown in complete detail. Other embodiments may be developed without departing from the spirit of the invention or from the scope of the appended claims.

I claim:

1. A method of producing ball-shaped particles, said method comprising:

supplying liquid into a vessel comprising a bottom plate having a plurality of openings therein;

vibrating the vessel thereby delivering streams of the liquid down through the plurality of openings;

passing the streams of the liquid through a sufficient amount of gas such that the gas dissects the streams thereby forming a plurality of droplets, such that the gas affects a surface tension of the droplets passing therethrough thereby creating ball-shaped particles and such that the gas solidifies the ball-shaped particles; and positioning a bottom plate such that the solidified ball-shaped particles impact the bottom plate at an angle that is not normal to the bottom plate and move along a length of the bottom plate.

2. The method of claim 1, further comprising:

delivering the solidified ball-shaped particles into a container; and selecting, with a selecting device, a number of the solidified ball-shaped particles that are substantially equal in diameter and the have a luster on an outer surface thereof.

3. The method of claim 2, wherein said supplying liquid comprises supplying liquid metal.

4. A device for producing ball-shaped particles, said device comprising:

a housing having a ceiling and a bottom, said ceiling having a ceiling opening, said bottom having a bottom opening;

a vessel comprising a bottom plate having a plurality of openings and being located at said ceiling opening, each of said plurality of openings having a size that prevents a liquid from flowing therethrough while under a static condition as a result of a surface tension of the liquid, a mount disposed on said ceiling of said vessel, a vibrator disposed on said mount in such a manner as to be operable to vibrate said vessel sufficiently to permit streams of the liquid to flow through said plurality of openings toward said bottom of said housing;

a pipe disposed in communication with said housing and operable to deliver gas into said housing; and a plate located a direction of flow each of the streams of liquid flowing through said plurality of openings toward said bottom of said housing and disposed such that the direction of flow is not normal to said plate.

5. The device of claim 4, further comprising an exhaust pipe in communication with said bottom opening, wherein said plate is disposed at a position adjacent to said exhaust pipe and at a location sufficiently separated from said ceiling of said housing such that each of the streams of liquid that flows through one of said plurality of openings toward said plate separates into a plurality of droplets that solidify prior to contacting said plate, and wherein said plate is disposed at an angle that enables solidified droplets to move toward said exhaust pipe.

6. The device of claim 5, further comprising a selector that is capable of permitting solidified droplets of a substantially predetermined size and shape to pass through said exhaust pipe.

7. The device of claim 6, wherein said selector comprises a mesh, a gravitation selector or a wind selector.

8. The device of claim 7, wherein said selector is disposed approximate to said bottom opening of said housing.

9. The device of claim 8, further comprising a valve disposed in said pipe and being operable to control an amount of gas to be delivered into said housing.

10. The device of claim 9, further comprising:

a second pipe disposed in communication with said housing and operable to deliver gas into said housing, and a second valve disposed in said second pipe and being operable to control an amount of gas to be delivered into said housing.

11. The device of claim 10, wherein said pipe and said second pipe are capable of delivering nitrogen or an inert gas into said housing.

12. The device of claim 11, wherein said housing comprises a cylindrical metallic housing.

13. The device of claim 12, wherein each of said plurality of openings have a size that prevents a stream of liquid metal from flowing therethrough while under a static condition as a result of a surface tension of the liquid metal.

14. The device of claim 13, wherein said plate is disposed at a location sufficiently separated from said ceiling of said housing such that each of the streams of liquid metal that flows through one of said plurality of openings toward said plate separates into a plurality of metal droplets and solidifies prior to contacting said plate, and wherein said plate is disposed at an angle that enables solidified metal droplets to move toward said exhaust pipe.

15. The device of claim 14, wherein said plate comprises a material layer disposed such that the solidified metal droplets contact said material layer, and wherein said material layer is softer than that of a portion of said plate that is disposed beneath said material layer.

16. The device of claim 15, wherein said material layer comprises at least one of a plate or cloth.

17. The device of claim 16, wherein said material layer comprises at least one of inorganic fiber, vegetable fiber and pulp.

18. The device of claim 17, wherein said inorganic fiber comprises rock wool.

19. The device of claim 18, wherein said inorganic fiber comprises woven fabric.

20. The device of claim 19, wherein said material layer comprises a plurality of layers.

21. The device of claim 20, wherein said plurality of layers comprises at least one layer of air.

22. The device of claim 21, wherein said cylindrical metallic housing contains inert gas comprising nitrogen.

23. The device of claim 4, wherein each of said plurality of openings have a size that prevents a stream of liquid metal from flowing therethrough while under a static condition as a result of a surface tension of the liquid metal.

24. The device of claim 23, wherein said plate is disposed at a location sufficiently separated from said ceiling of said housing such that each of the streams of liquid metal that flows through one of said plurality of openings toward said plate separates into a plurality of metal droplets and solidifies prior to contacting said plate.

* * * * *